United States Patent [19]

Folkard et al.

[11] Patent Number: 4,687,728

[45] Date of Patent: Aug. 18, 1987

[54] RADIATION SENSITIVE COMPOSITIONS

[75] Inventors: Christopher W. Folkard; Christopher R. Millross, both of Leeds, England

[73] Assignee: Vickers PLC, London, England

[21] Appl. No.: 614,993

[22] Filed: May 29, 1984

[30] Foreign Application Priority Data

May 31, 1983 [GB] United Kingdom ............... 8314918

[51] Int. Cl.[4] ............................................. G03C 1/495
[52] U.S. Cl. .................................... 430/270; 430/145; 430/171; 430/177; 430/280; 430/287; 430/272; 430/307; 430/330
[58] Field of Search ............... 430/292, 328, 330, 350, 430/280, 191, 145, 293, 171, 179, 287, 196, 270, 309

[56] References Cited

U.S. PATENT DOCUMENTS

| 3,647,448 | 3/1972 | De Meyer et al. | 430/350 |
| 3,957,515 | 5/1976 | Robillard | 430/330 |
| 4,518,669 | 5/1985 | Yashiki | 430/57 |
| 4,599,410 | 7/1986 | Gunther | 544/137 |

FOREIGN PATENT DOCUMENTS 1343671 1/1974 United Kingdom ................ 430/58

Primary Examiner—John E. Kittle
Assistant Examiner—José G. Dees
Attorney, Agent, or Firm—Poms, Smith, Lande & Rose

[57] ABSTRACT

Radiation sensitive compositions are image-wise exposed and developed to form an image which is then heated to improve its strength as a lithographic printing image or etch resist. The heating is carried out in the presence of a heat sensitive dye which undergoes a color change at a temperature of at least 180° C. so as to obtain an indication of whether or not the heating has been adequate. The dye may be an integral component of the composition or it may be applied to the image, after development, in combination with a substance capable of forming a shield against contaminating residues produced during the heating step.

7 Claims, No Drawings

RADIATION SENSITIVE COMPOSITIONS

This invention relates to radiation sensitive compositions, to radiation sensitive devices, in particular radiation sensitive plates for lithographic printing plate production and photo-resists comprising substrates coated with such compositions, and to the processing of such radiation sensitive devices.

Radiation sensitive devices of the type with which the present invention is concerned conventionally consist of a radiation sensitive composition coated on a suitable substrate. Image-wise exposure of the device to radiation using a suitable transparency causes the coating to change its characteristics in the areas struck by radiation so that the coating may be selectively removed from the substrate in the non-image areas by application of a suitable developer to leave a printing image (or etch resistant area) on the substrate. In the case of the so-called negative-working devices; it is the case of the so-called negative-working devices, it is the non-radiation-struck areas of the coating which are removed.

As is well known, it is possible to strengthen printing images or etch resistant areas by baking or burning-in in the processed devices at a temperature of 180 deg C. or above. In the case of some lithographic printing plates, the run length can be extended by 2 or 3 times using such treatment.

It is desirable that some indication is provided that the device has been baked and moreover that the device has been sufficiently baked to obtain the maximum effect.

It is an object of this invention to provide such an indication and this is achieved in accordance with the present invention by baking the developed device in the presence of a heat sensitive dye which undergoes a colour change at a temperature of 180° C. or more.

The heat sensitive dye may be incorporated in the radiation sensitive composition.

Accordingly, one aspect of the present invention provides a radiation sensitive composition comprising a radiation sensitive material and a heat sensitive dye which undergoes a colour change at a temperature of at least 180° C.

Any radiation-sensitive material may be used in the compositionn of the present invention. Whilst some compositions may not in themselves benefit from baking, an improvement in the strength of such compositions may be obtained by including, in the compositions, a support resin which does benefit from baking. The radiation-sensitive composition may also contain a substance which produces a colour change on exposure to radiation.

In the case where the composition is coated onto a substrate to form a radiation sensitive device, the substrate may be, for example, grained and anodised aluminium or other substrate conventionally used in the production of lithographic printing plates or in etching processes.

In use of such radiation sensitive devices the radiation sensitive composition is image-wise exposed to radiation and then developed to selectively remove the more soluble areas of the composition and reveal the underlying substrate and to leave an image on the substrate constituted by the less soluble areas. Subsequent baking of the developed device is then carried out until the dye in the composition undergoes its colour change. In this way it can readily be ascertained that the developed device has been heated to the required temperature. The actual colours involved will depend upon the particular dye used and upon any colour which the image may inherently have as a consequence of other components of the radiation sensitive composition.

A well known disadvantage of baking some radiation sensitive devices is that during the baking step contaminating residues are formed and these become deposited on the background areas (i.e. the non-image areas of the printing plate or the areas to be etched of the photo-resist). This is particularly serious in the case where the device is to be used in the production of a lithographic printing plate as the contaminating residues cause scumming during subsequent printing and render the printing plate useless even if they are present to only a small degree.

This problem can be overcome by treating the device with a processing liquid before baking, in accordance with our Thermotect (RTM) process described in our G.B. Pat. No. 1513368 whereby a thin coating of a protective substance is applied to the device before baking. This protective substance forms a layer which shields the background areas from the contaminating residues and, as it is water soluble and remains water soluble during the baking step, it and the contaminating residues can be readily washed off with water after the baking step.

If desired the heat sensitive dye may be incorporated in such a processing liquid in accordance with the present invention.

Accordingly, another aspect of the present invention provides a method of forming an image or etch resistant area which comprises image-wise exposing a radiation sensitive device comprising a radiation sensitive composition coated on a substrate; developing the device to selectively remove the more soluble areas of the composition to reveal the underlying substrate and leave an image or etch resistant area constituted by the less soluble areas; coating the developed device with a processing liquid comprising a heat sensitive dye which undergoes a colour change at a temperature of at least 180° C. and a protective substance to shield the revealed underlying substrate from contaminating residues formed when the developed device is heated to a temperature of at least 180° C.; heating the coated device until the dye exhibits a colour change; and washing the device to remove the coating.

Further, according to yet another aspect of the present invention there is provided a processing liquid for use in treating a radiation sensitive device which has been image-wise exposed to radiation and developed to form an image or etch resistant area on a substrate, which processing liquid comprises a heat sensitive dye which exhibits a colour change at a temperature of at least 180° C. and a protective substance to shield the device from contaminating residues formed when the device is heated to a temperature of at least 180° C. to harden the image or etch resistant area.

The protective substance in the processing liquid may be any one of, or a mixture of, the substances described in G.B. Pat. Nos. 1513368, 1534424 and 1555233 or G.B. patent application No. 2099371 and it is advantageous for the processing liquid also to contain a film forming agent, for example poly(vinyl alcohol). It is particularly preferred for the protective substance to be a surfactant such as sodium dodecyl phenoxy benzene disulphonate, a sodium salt of an alkylated naphthalene sulphonic acid, the disodium salt of methylene dinaphthalene sulphonic acid, sodium dodecyl benzene sulphonate, or a sodium salt of a sulphonated alkyl diphenyl oxide.

In accordance with a preferred embodiment of the invention, the dye is a delocalised, cationic, azo dye, in which the positive charge in the dye molecule participates in the chromophoric resonance conjugation system of the dye.

A particularly preferred dye of this type contains the chromophoric group:

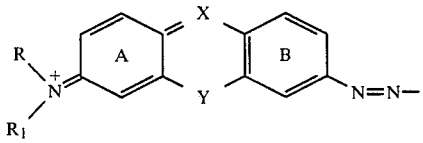

where X represents CH, CR$_2$ or N;
Y is optional and, if present represents a single bond, —(CH$_2$)$_n$— wherein n is 1 or 2,

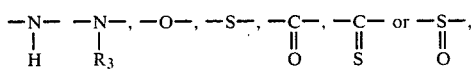

R, R$_1$, R$_2$ and R$_3$, which may be the same or different, each represents H, or an alkyl, substituted alkyl, aryl, substituted aryl or heterocyclic group, and rings A and B are optionally substituted and/or are optionally fused to aromatic or heterocyclic rings.

Another preferred dye of this type contains the chromorphoric group

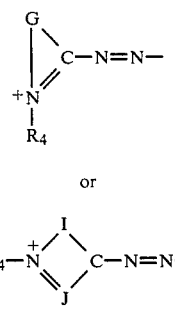

wherein R$_4$ represents H or an alkyl, substituted alkyl, aryl, substituted aryl or alkoxy group, and G, and I and J taken together, represent the atoms required to complete a 5- or 6-membered nitrogen-containing heterocyclic ring. G, I, and J may, for example, be carbon, nitrogen, oxygen and/or sulphur atoms and the ring may be fused to an optionally substituted ring system.

The azo linkage of the above dyes may be connected to the residue of a diazonium compound or to the residue of a coupling component.

Examples of dyes containing the group I are

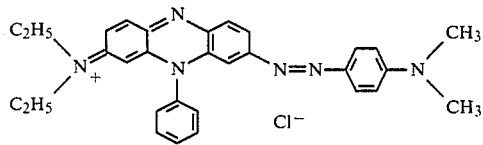

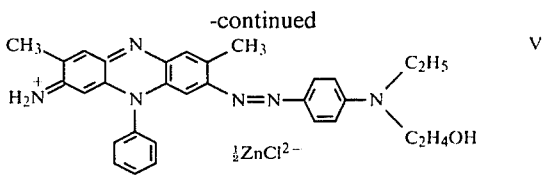

These dyes are blueish-green in colour and change to red-violet on heating to 180° C. or more. Formulae VI to IX illustrate further examples of dyes containing the group I.

An example of a dye containing the group II is

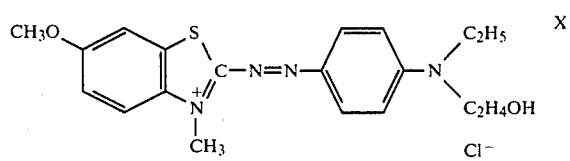

This dye is greenish blue in colour and decolourises on heating to a temperature of at least 180° C. Formulae XI to XXV illustrate other dyes of this type.

Dyes containing group III are illustrated by Formulae XXVI to XXVIII.

Generally, the radiation sensitive compositions of the present invention will contain up to 20% by weight (preferably up to 10% by weight) of the dye, based on the weight of the composition. The processing liquids of the present invention will generally contain up to about 1% by weight of dye, depending upon solubility, and up to about 20% by weight of protective substance, based on the total weight of the liquid.

The anionic portion of the cationic dyes has little, if any, affect on the properties of the dyes other than their solubility. Any anion may be used, for example chloride, zinc chloride, tetrafluoroborate, hexafluorophosphate, sulphate, acetate, methyl sulphate, phosphomolybdate, phosphotungstate, phosphotungstomolybdate, or a sulphonate such as p-toluene sulphonate, naphthalene sulphonate or trisopropyl naphthalene sulphonate. Chloride and zinc chloride anions are particularly suitable as regards aqueous solubility.

Whilst the reason the dyes change colour is not completely understood, it is believed that the azo linkage breaks at elevated temperature to give heat decomposition products which are colourless or of a different colour to the dye.

In all the examples of dyes given, the positive charge is shown to be associated with a specific nitrogen atom within the dye molecule. In practice, the positive charge will be spread, or delocalised, over the entire chromophoric structure of the dye.

The following Examples illustrate the invention.

EXAMPLE 1

A positive working radiation sensitive composition was prepared by mixing together:
6 g: Naphthoquinone diazide sulphonic ester (radiation sensitive material)
27 g: Novolak resin (support resin)
0.48 g: 4-diazo diphenylamine fluoro borate
0.36 g: Sudan Yellow.
The mixture was then made up to 400 ml with 95/5 Acetone/Methyl Oxitol.

The diazo diphenylamine fluoroborate produces acid on exposure and the acid causes the Sudan Yellow dye to change colour.

The composition was split into 3 equal portions A to C and dyes were added as follows to portions B and C
Portion (B) 0.4 g Flexo Blue 810 (TPM solvent dye)
Portion (C) 0.1 g Janus Green B (formula IV)

Each portion of the composition was then whirler coated onto sheets of eletrolytically grained, sulphuric acid anodised aluminium to give coating weights of 2.5 gm per sq.m. The coatings were then dried at 100 deg C. for 5 minutes.

The resultant radiation sensitive plates A to C were exposed under a positive transparency on a Berkey-Ascor frame for 18 units (approx. 36 seconds), giving in the case of Plate A a yellow image area, and in the case of Plates B and C green image areas, against a red background. These colours, and the other colours referred to in this (and the other) Examples were as seen under yellow safelight. The plates were dish-developed in aqueous alkaline developer for 45 seconds.

The developed plates were all treated with a 10% solution of sodium dodecyl phenoxybenzene disulphonate (protective substance), then buffed down until dry, and baked in an oven for 10 minutes at 200 deg C. The colour of the images of the baked plates was then evaluated.
Plate A: No change
Plate B: Dull green
Plate C: Reddish brown.

The comparison shows that whereas the image formed from the composition of the invention had a good colour change on baking, the colour change of the image formed from the composition containing the TPM solvent dye for comparison purposes was inadequate.

Further samples of plate C were baked for 10 minutes at different temperatures. After baking the following image colours were observed:
160 deg C.: Dull olive
180 deg C.: Neutral grey
200 deg C.: Reddish brown
220 deg C.: Reddish brown.

EXAMPLE 2

A negative-working radiation-sensitive composition was prepared from:
3% of the epoxy resin ester of 4-azido-alpha-cyano-delta-chloro-cinnamylidene acetic acid (radiation sensitive material), and
0.3% of 1,2 Benzanthraquinone (sensitiser)
in ethyl methyl ketone.

The composition was split into portions D to F and dyes were added to portions E and F as follows:
Portion E 0.3% Microlith Blue A3RK
Portion F 0.2% Janus Green B.

Each portion of the composition was whirled into sheets of electrolytically grained, sulphuric acid anodised aluminium to given coating weights of 1.1 gm per sq.m. The coatings were dried at 65 deg C. for 5 minutes.

The resultant plates were image-wise exposed under a negative transparency for 25 units on a Berkey-Ascor frame, and developed with a solvent developer to give lithographic printing plates having a yellow image (Plate D) and green images (Plates E and F) against colourless backgrounds. The plates were treated with an aqueous solution of sodium dodecyl phenoxy benzene disulphonate (protective substance) and baked in an oven for 10 minutes at 200 deg C. After baking, the following plate colours were observed:
Plate D: No change
Plate E: Dull green
Plate F: Reddish brown.

The comparison shows that whereas the image formed from the composition of the invention had a good colour change on baking, the colour change of the image formed from the composition containing the Microlith Blue A3RK dye for comparison purposes was inadequate.

EXAMPLE 3

A processing liquid was prepared to the following formulation:
10 g Sodium dodecyl phenoxy benzene sulphonate (protective substance)
3 g Poval 105 polyvinyl alcohol (film forming agent)
0.4 g Janus Green B
Water to 100 mls.

An exposed and developed plate (plate A from Example 1) having a yellow image was treated with this solution, and buffed down to give a plate with an overall greenish blue colouration. The plate was then baked in an oven for 10 minutes at 220 deg C. whereupon the plate became pale violet in colour in the background areas. The plate was washed with water and inked-in. There was no contamination of the background areas.

EXAMPLE 4

Example 3 was repeated using a plate identical to plate D of Example 2. Similar results were obtained.

EXAMPLE 5

Examples 1 to 4 were repeated except that an infrared baking apparatus was used instead of a conventional oven. Similar results were obtained.

EXAMPLE 6

Examples 1 and 2 were repeated using the dyes of formulae V to XXVIII. The resultant colour changes of the image on heating to 200° C. are shown in the following Table 1.

TABLE 1

| Dye | Example 1 procedure | | Example 2 procedure | |
| --- | --- | --- | --- | --- |
| | before heating | after heating | before heating | after heating |
| V | green | red/brown | green | brown |
| VI | dull green | orange/red | dull green | chocolate brown |
| VII | green | red/brown | green | chocolate brown |
| VIII | grey | yellow/orange | grey | brown |
| IX | grey | chocolate brown | grey | deep brown |
| X | green | pale yellow | green | brown |
| XI | green | yellow | green | brown |
| XII | dull green | yellow | dull green | light brown |
| XIII | dull green | brown | dull green | brown |
| XIV | dull green | brown | dull green | deep brown |
| XV | green | yellow | green | brown |
| XVI | green | " | green | " |
| XVII | green | " | green | " |
| XVIII | dull green | " | dull green | " |
| XIX | grey | " | grey | light brown |
| XX | grey | " | grey | " |
| XXI | grey | " | grey | " |
| XXII | red | " | red | " |
| XXIII | red | " | red | " |

TABLE 1-continued

| | Example 1 procedure | | Example 2 procedure | |
|---|---|---|---|---|
| Dye | before heating | after heating | before heating | after heating |
| XXIV | red | " | red | " |
| XXV | red | " | red | " |
| XXVI | grey | " | grey | " |
| XXVII | dull brown | " | dull brown | " |
| XXVIII | dull brown | " | dull brown | " |

EXAMPLE 7

Example 3 was repeated with the dye replaced by the dyes of Formulae V to XXVIII. The colour change of the background areas occurring on heating to 200° C. are shown in the following Table 2.

TABLE 2

| Dye | Before heating | After heating |
|---|---|---|
| V | green | red |
| VI | green | red |
| VII | green | violet |
| VIII | — | — } insoluble |
| IX | — | — |
| X | green | colourless |
| XI | green | colourless |
| XII | dull green | " |
| XIII | dull green | yellow/brown |
| XIV | dull green | orange |
| XV | green | colourless |
| XVI | " | " |
| XVII | " | " |
| XVIII | dull green | " |
| XIX | grey | " |
| XX | " | " |
| XXI | " | " |
| XXII | red | " |
| XXIII | " | " |
| XXIV | " | " |
| XXV | " | " |
| XXVI | grey | " |
| XXVII | dull brown | " |
| XXVIII | dull brown | " |

EXAMPLE 8

A photopolymerisable composition was prepared from:

6 g dimethacrylate ester of digylcidyl ether of bisphenol A 2 g Surcol 836 (Allied Colloids) carboxylated acrylic resin 0.3 g 2,4, bistrichloromethyl 6, 4'-methoxy naphthyl s-triazine photo-initiator, and 0.3 g phenyl azo diphenylamine made up to 200 mls with ethyl methyl ketone.

The composition was split into 2 equal portions, A and B, and dyes were added as follows:

(A) 0.15 Savinyl Blue GLS (solvent dye)

(B) 0.15 g dye of formula VI.

Each portion of the composition was whirler-coated onto sheets of electrolytically grained and anodised aluminium and dried, to give coating weights of 1 g $m^{-2}$. The dried layers were overcoated with poly(vinyl alcohol) to prevent oxygen inhibition.

The resultant radiation sensitive plates were exposed under a negative transparency on a Berkey-Ascor printing down frame for 5 units (approx. 10 seconds). In the case of each plate, a red colouration was produced in the image areas, against a green background. The plates were hand-developed in alkaline surfactant solution for 30 seconds, giving dark green image areas against a white background. The plates were treated with an aqueous solution of sodium dodecyl phenoxy benzene disulphonate (protective substance) and baked in an oven for 10 minutes at 200° C. After baking, the image on plate A was still green, whilst the image on plate B had changed to a light brown colour.

In most cases, the colour changes would be similar when seen under white light. Although some would be different. The change would be discernible. Thus the dye of formula VII in Example 2 would change from violet to yellow/brown under white light.

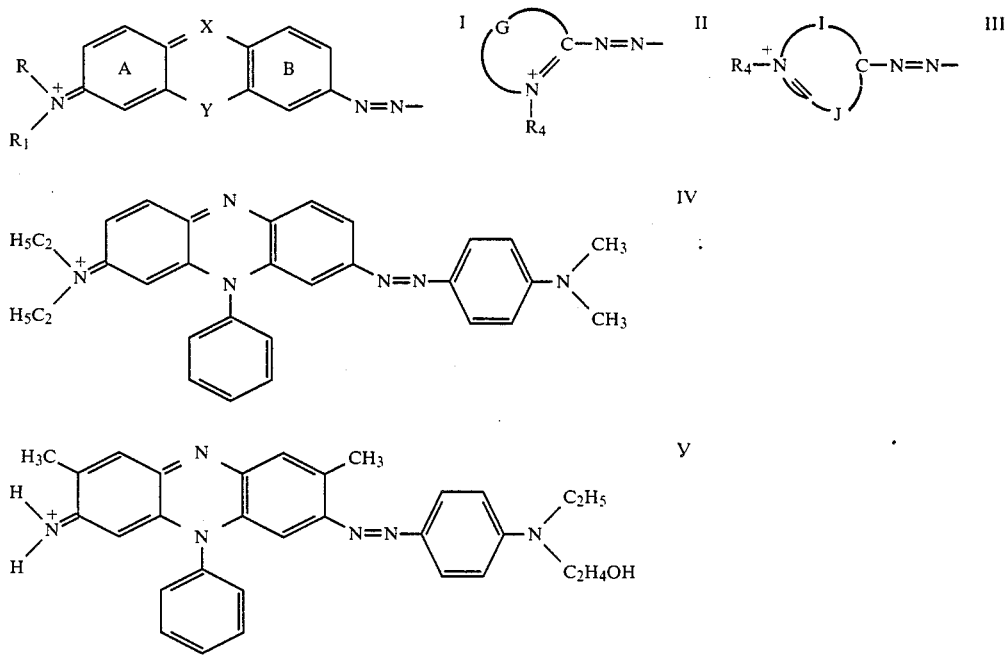

-continued
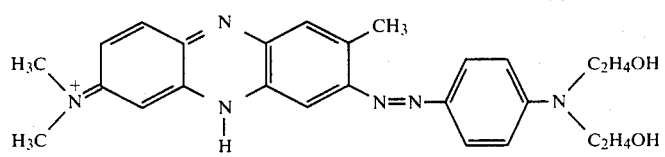
VI
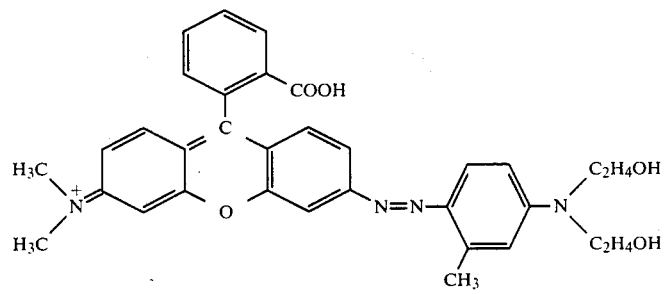
VII
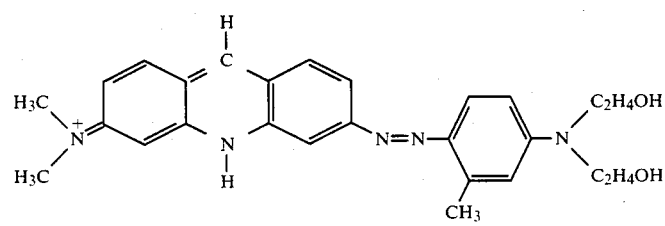
VIII
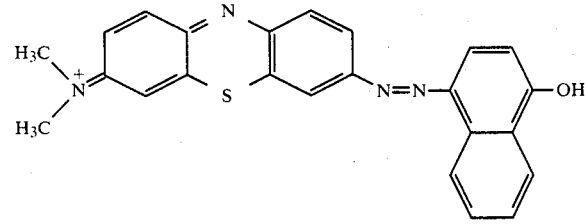
IX
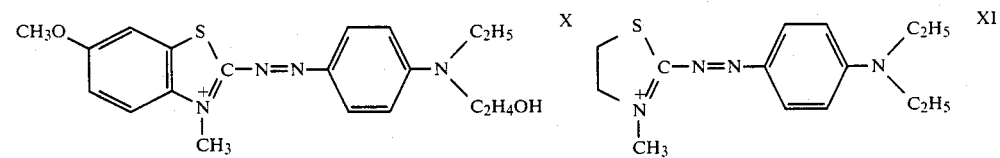
X    XI
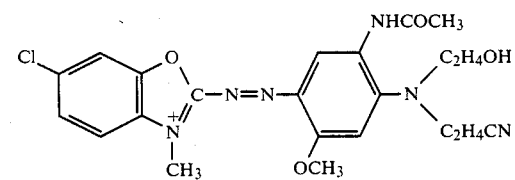
XII
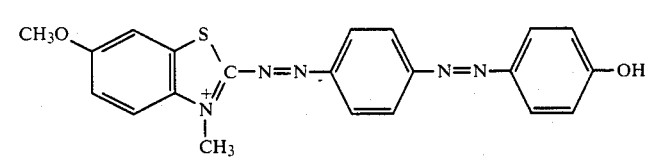
XIII
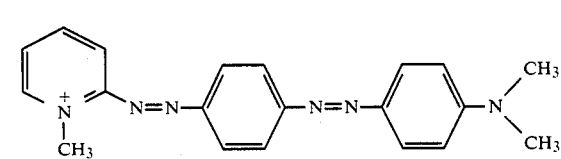
XIV
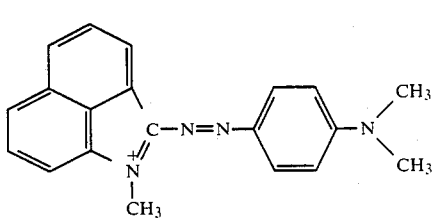
XV

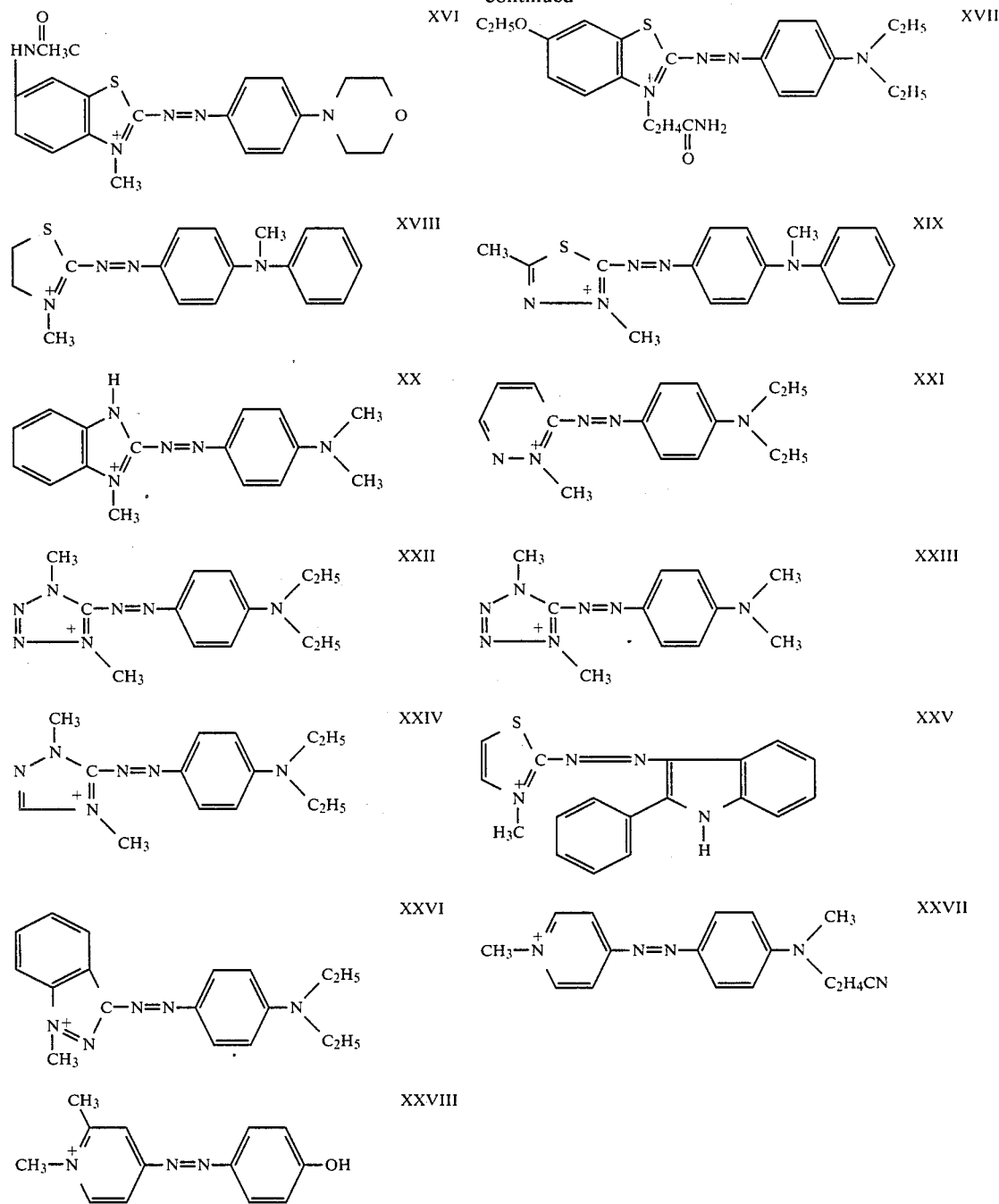

We claim:
1. A radiation sensitive composition comprising a radiation sensitive material which, upon exposure to radiation, exhibits image areas and non-image areas of differing solubility and a heat sensitive cationic, azo dye, having a chromophoric resonance conjugation system and a positive charge distributed over the system, the dye being such as to undergo a color change at a temperature of at least 180° C. and being present in an amount effective to cause the composition to change color when it is heated to said temperature after exposure to radiation.

2. A composition as claimed in claim 1, wherein the chromophoric resonance conjugation system includes the group:

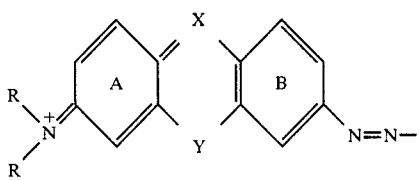

where
X represents, CH, CR$_2$ or N;

Y is optional and if present represents a single bond, —(CH$_2$)$_n$— where n is 1 or 2,

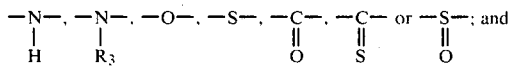

R, R$_1$, R$_2$ and R$_3$, which may be the same or different, each represents H or an alkyl, substituted alkyl, aryl, substituted aryl or alkoxy group; and ring A and B are optionally substituted and/or optionally fused to aromatic or heterocyclic rings.

3. A composition as claimed in claim 1, wherein the chromophoric resonance conjugation system includes the chromophoric group

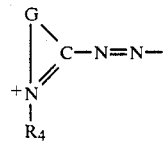

-continued

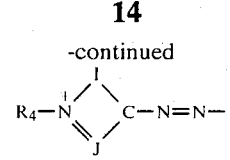

where
R$_4$ represents H, or an alkyl, substituted alkyl, aryl, substituted aryl or alkoxy group and
G, and I and J taken together, represent the atoms required to complete a 5- or 6-membered nitrogen-containing, heterocyclic ring which is optionally fused to an optionally substituted ring system.

4. A composition as claimed in claim 1, in which the dye comprises up to 20% by weight of the composition.

5. A composition as claimed in claim 1, wherein said radiation sensitive material exhibits image areas and non-image areas of differing solubility in aqueous alkaline developers.

6. A composition as claimed in claim 1, wherein said radiation sensitive material exhibits image areas and non-image areas of differing solubility in solvent developers.

7. A composition as claimed in claim 1, wherein said radiation sensitive material exhibits image areas and non-image areas of differing solubility in surfactants.

* * * * *